United States Patent [19]

Matsumoto et al.

[11] Patent Number: 4,547,798

[45] Date of Patent: Oct. 15, 1985

[54] SOLID-STATE COLOR IMAGING DEVICE AND THE PREPARATION OF SAME

[75] Inventors: Kenji Matsumoto, Kaisei; Shoichi Yamamoto; Jun Hayashi, both of Minami-ashigara, all of Japan

[73] Assignee: Fuji Photo Film Co. Ltd., Japan

[21] Appl. No.: 556,540

[22] Filed: Nov. 30, 1983

[30] Foreign Application Priority Data

Nov. 30, 1982 [JP] Japan ................................. 57-208563

[51] Int. Cl.$^4$ ........................ H04N 9/04; H04N 9/07; G02B 5/22; G03C 7/04
[52] U.S. Cl. ........................................ 358/44; 358/41; 358/253; 430/7; 430/289; 430/642; 430/905; 252/582; 313/371; 313/374; 350/311; 350/317
[58] Field of Search ........................... 358/44, 41, 253; 350/317, 311; 252/582; 430/7, 289, 905, 271, 270, 642; 313/371, 374

[56] References Cited

U.S. PATENT DOCUMENTS

| | | | |
|---|---|---|---|
| 4,204,866 | 5/1980 | Horak et al. | 358/44 |
| 4,285,007 | 8/1981 | Nakano et al. | 358/44 |
| 4,355,087 | 10/1982 | Martin | 430/289 |
| 4,416,961 | 11/1983 | Drexhage | 358/44 |
| 4,430,666 | 2/1984 | Nakatsui et al. | 358/44 |
| 4,479,143 | 10/1984 | Watanabe et al. | 358/44 |

*Primary Examiner*—Richard L. Schilling
*Attorney, Agent, or Firm*—Murray, Whisenhunt and Ferguson

[57] ABSTRACT

A solid-state color imaging device carrying a micro-color filter which is reduced in its alkali metal ion content to a level of not more than 100 ppm is prepared through formation of a substrate of at least one colored resin layer of the micro-color filter using, as the substrate material, a water-soluble protein such as gelatin whose alkali metal ion content is not more than 20 ppm.

4 Claims, No Drawings

SOLID-STATE COLOR IMAGING DEVICE AND THE PREPARATION OF SAME

BACKGROUND OF THE INVENTION

1. Field of the Invention

This invention relates to a solid-state color imaging device and a process for the preparation of the same.

2. Description of the Prior Arts

There has been heretofore known a color imaging tube provided with a micro-color filter on its image sensing surface which has been conventionally incorporated into a camera for a video tape recording (VTR) system to collect color signals corresponding to a color image.

Recently, a variety of solid-state imaging devices such as CCD, BBD and MOS have been proposed and studied for replacing the conventional imaging tubes. Accordingly, a number of trials for providing a solid-state color imaging device employing a combination of the solid-state imaging device and a micro-color filter have been carried out for the purpose of reducing the dimension of a VTR camera. Such a solid-state color imaging device is now partially put to practical use replacing the conventional color imaging tube.

The solid-state color imaging device is provided on its image sensing surface with a combination of photoelectronic convertor elements, generally called image sensor elements, and flat highly-integrated scanning circuits. On the image sensing surface, there is provided a micro- color filter comprising a plurality of micro-color filter elements (colored resin layers) in a mosaic or striped pattern, each of which is colored with a dye such as red, green or blue, otherwise, cyan, magenta or yellow, to match each of the plurality of image sensor elements.

The micro-color filter is generally provided to the solid-state imaging device by a laminating process or an on-wafer process. The laminating process involves initially forming micro-color filter elements on a transparent support such as glass plate to produce a micro-color filter matching an array of the image sensor elements of the solid-state imaging device to which the micro-color filter is provided, and then thus produced micro-color filter is superposed on the imaging surface of the solid-state imaging device under adhesion. The laminating process accordingly requires so careful arrangement that each colored micro-filter element of the independently produced filter assembly can be placed on the image sensing surface to precisely match each imaging sensor element of the solid-state imaging device.

In contrast, the on-wafer process involves formation of the micro-color filter directly on the imaging surface of the solid-state imaging device. Therefore, the on-wafer process can be additionally incorporated into the production line of the solid-state imaging device, and which makes the production of solid-state color imaging device easier.

The on-wafer process can be carried out by two alternative embodiments: one embodiment involves simultaneous production of numerous solid-state color imaging devices by forming colored micro-filter elements on a wafer where numerous solid-state imaging devices are arranged, so that the array of respective micro-filter element matches the corresponding image sensor elements, and another embodiment (on-chip process) involves the first stage of separating an individual solid-state imaging device (chip) from a wafer containing numerous solid-state imaging devices and the second stage of forming a colored micro-filter on the individual chip. In this specification, the term "on-wafer process" includes both the two alternative embodiments.

A representative process for the preparation of a solid-state color imaging device, that is, a process for forming a micro-color filter comprising at least one colored resin layer on an image sensing surface on a solid-state imaging device can be described as follows:

A solution of a photo-hardening resin is coated on the image sensing surface to form a photo-hardening resin layer, and this resin layer is exposed to a radiation through a mask having windows in the desired pattern to harden the resin layer in a mosaic or striped pattern. A resin of the unhardened portion is then removed by washing with an appropriate solvent. Thus hardened resin layer (substrate layer) in a mosaic or striped pattern is subsequently colored with a dye to prepare a colored resin layer. This procedure is further repeated, if desired, to prepare a plurality of colored resin layers to complete the formation of a micro-color filter on the solid-state imaging device.

As the polymer material for the preparation of the hardened-resin layer (substrate layer), a water-soluble protein such as gelatin is generally employed. However, there arises a problem derived from alkali metal ions contained in the protein. For instance, a gelatin generally contains approx. 100-2000 ppm of sodium ion ($Na^+$) and approx. 20-200 ppm of potassiun ion ($K^+$).

As described above, the solid-state imaging device comprises image sensor elements and flat-highly integrated scanning circuits, the solid-state imaging device is easily damaged by contamination with impurities such as dust and alkali metals. The solid-state imaging device damaged by the contamination with such impurities shows poor levels in the predetermined characteristics, and thus the yield of acceptable products are rendered low. For this reason, very careful arrangements ought to be provided to a stage for the provision of the micro-color filter to prevent contamination with such impurities as completely as possible.

Particularly, the contamination with a large amount of alkali metals such as sodium and potassium is liable to bring about certain troubles in the operation of the solid-state imaging device. In order to keep the device from lowering of the reliability, it is desired that the amount of alkali metals introduced into the solid-state color imaging device should be made as little as possible. It is now discovered that a solid-state color imaging device, for instance, a CCD type solid-state color imaging device having approx. 0.5 $cm^2$ of respective image sensing surface area, should not contain more than 100 ppm of alkali metal ions in one chip. Particularly, the alkali metal ions contained in one chip preferably does not exceed 50 ppm.

A solid-state color imaging device having so reduced alkali metal content, however, is hardly obtained by the use of the aforementioned untreated gelatin having the high alkali metal content. Even if gelatin is treated with lime, an acid, or the like, the so treated gelatin still contains a large amount of alkali metals. For instance, gelatin treated with lime ordinarily contains approx. 150 ppm of alkali metals, and gelatin treated with an acid ordinarily contains approx. 500 ppm of alkali metals. The use of the gelatin having alkali metals of so high content introduces the contamination into the solid-state color imaging device.

SUMMARY OF THE INVENTION

An object of the present invention is to provide a solid-state color imaging device which is prominently reduced in the contamination with alkali metals and shows high product reliability.

Another object of the invention is to provide a process for the preparation of a solid-state color imaging device which is prominently reduced in the contamination with alkali metals.

A further object of the invention is to provide a solid-state color imaging device provided with at least one resin layer thereon which is of value for the preparation of a solid-state a color imaging device prominently reduced in the contamination with alkali metals.

There is provided by the present invention a solid-state color imaging device provided with a micro-color filter thereon characterized in that the total alkali metal ion content of the color imaging device is not more than 100 ppm.

The present invention also provides a process for the preparation of a solid-state color imaging device comprising at least one colored resin layer provided on an image sensing surface of a solid-state imaging device, which is characterized in that said colored resin layer is prepared by using as the substrate material a water-soluble protein whose alkali metal ion content is not more than 20 ppm.

The present invention further provides a solid-state imaging device provided with at least one resin layer thereon characterized in that said resin layer is made of a water-soluble protein whose total alkali metal ion content is not more than 20 ppm.

According to the present invention, the contamination of a solid-state color imaging device with alkali metals is effectively reduced, particularly, by the use of a water-soluble protein whose alkali metal content is limited up to 20 ppm, as material of the substrate of the colored resin layer of a micro-color filter to be provided on an image sensing surface of a solid-state imaging device, whereby upgrading the product reliability of the solid-state color imaging device.

DETAILED DESCRIPTION OF THE INVENTION

Examples of the water-soluble protein employable in the present invention include water-soluble proteins (e.g., gelatin and casein) having been processed to highly decrease the total alkali metal ion content. The process for highly decreasing the total alkali metal content of water-soluble proteins can be preferably performed by an ion-exchange procedure, because the ion-exchange procedure is advantageous in efficient removal of alkali metal ions contained in the protein. The removal of alkali metal ions from a water-soluble protein by the ion-exchange procedure can be carried out by causing an aqueous solution of the water-soluble protein passing through a column charged with an ion-exchange resin capable of exchanging the alkali metal ions. A number of such ion-exchange resins are well known.

The water-soluble protein employable for the formation of a substrate of the colored resin layer to be provided on an image sensing surface of the solid-state imaging device in accordance with the present invention should not contain alkali metals of more than 20 ppm (total bassis) in dry state. The total alkali metal content in the protein is preferably not more than 10 ppm, more preferably not more than 5 ppm.

The water-soluble protein preferably is gelatin.

In the present invention, the provision of a micro-color filter onto an image sensing surface of a solid-state imaging device is preferably carried out by the on-wafer process. Said process can be done in the following manner.

In the first place, a photo-hardening protein solution is prepared from a water-soluble protein having the total alkali metal content of not more than 20 ppm and a photo-hardening reagent. The photo-hardening protein solution is then coated over an image sensing surface (or, over a protective layer or other layer provided on the image sensing surface) of a solid-state imaging device to form a photo-hardening resin layer.

The photo-hardening resin layer is then exposed to a radiation through a mask having windows in the desired pattern (mosaic or striped pattern) to harden the resin layer in a mosaic or striped pattern. A resin of the unhardened portion is subsequently removed by washing with an appropriate solvent, for instance, warm water.

Thus prepared substrate (resin layer) in a mosaic or striped pattern is colored with a dye selected from red, green, blue, cyan, magenta, yellow, etc. to prepare a colored filter element I (colored resin layer I). As the dye employable for this purpose, a variety of dyes such as acid dyes, direct dyes and reactive dyes are known. These known dyes or the homologues are employed in the present invention.

In general, the dye employable for the above purpose contains an alkali metal in the molecule, and such alkali metal is also liable to cause the contamination of the solid-state color imaging device. However, since the amount of a dye employed for coloring the substrate to prepare a colored resin layer is apparently less than the amount of a water-soluble protein employed for the formation of the substrate, the alkali metals contained in the colored resin layer have their principal origin in the water-soluble protein in preference to the dye employed for coloring the resin layer. Accordingly, the purpose of the present invention can be attained even if a dye containing an alkali metal in the molecule is employed for coloring the resin layer.

Nevertheless, the dye to be employed is preferably a dye containing substantially no alkali metal which is represented by the formula (I):

$$D-(SO_3X)_m \qquad (I)$$

in which D is a dye moiety such as azo dye, bisazo dye, and phthalocyanine dye, X is a non-metallic cation, and m is an integer of 1 to 6.

Details of the dye represented by the formula (I) are given in U.S. patent application No. 522,312 filed Aug. 11, 1983.

On the colored filter element I prepared as above is provided a color stain-preventive intermediate resin layer, and on this layer is further formed another photo-hardening resin layer in the same manner. This resin layer is exposed to a radiation through a mask having windows in another pattern to partially harden the resin layer, and the unhardened portion is subsequently removed in a similar manner as above. The hardened resin layer in the mosaic or striped pattern is then colored with another dye to form a colored filter element II (colored resin layer II).

If necessary, the above-described procedure is further repeated to prepare a plurality of colored resin layers. Finally, a surface coating layer (surface-protecting layer) is superposed on the surface of the colored resin layer to complete the formation of a micro-color filter on the solid-state imaging device.

In the course of the above-described process or prior or subsequent to said process, a procedure for baring a bonding pad is probably incorporated to form circuits. Since this procedure does not directly relate to the present invention, no further mention to the procedure is given in this specification.

The above-mentioned color stain-preventive layer can be omitted if the colored resin layer is so treated as to prevent color contamination between two colored resin layers provided adjacently to each other.

The solid-state color imaging device comprising at least one colored resin layer whose substrate is formed using a gelatin having the highly reduced alkali metal content in accordance with the present invention is effectively protected from the contamination with detrimental alkali metal ions. Accordingly, the product reliability of the solid-state color imaging device prepared by the present invention is very high, so that a practically valuable solid-state color imaging device is provided.

The following examples will further describe the present invention.

EXAMPLE 1

A gelatin was processed by ion exchange procedure to reduce its alkali metal ion content, and mixed with aqueous ammonium bichromate to prepare an aqueous photo-hardening gelatin solution. Atomic absorption analysis indicated that the photo-hardening gelatin solution contained 1.65 ppm of $Na^+$ and 0.50 ppm of $K^+$.

The photo-hardening gelatin solution was coated on a CCD solid-state imaging device wafer comprising a great number of CCD solid-state imaging devices and being provided on its surface with a protective layer of phosphosilicate glass to prepare a photo-hardening gelatin layer. Subsequently, the photo-hardening gelatin layer was closely covered with a mask having windows in a mosaic pattern and was exposed to a radiation. The gelatin layer was then washed with warm water to remove the unhardened portion. Thus, a hardened gleatin layer in the mosaic pattern was formed.

The hardened gelatin layer was colored with a yellow dye (Suminol Milling Yellow MR, produced by Sumitomo Chemical Co., Ltd., Japan) to prepare a yellow colored resin layer.

On the yellow colored resin layer was formed another photo-hardening resin layer (0.2 μm in thickness) using a copolymer of ethyl p-phenylenediacrylate and an equivalent mole of 1,4-bis(β-hydroxyethyoxy)-cyclohexane (2% by weight of 2-benzoylmethylene-1-methyl-β-naphthothiazoline was contained as a photosensitizing agent). The photo-hardening resin layer was closely covered with a mask having windows in the area other than portions corresponding to the dicing sites and the bonding electrode (aluminium pad electrode) sites, and exposed to a radiation so as to harden the exposed portion. Thus exposed resin layer was washed to remove the unhardened portion ot form an intermediate resin layer.

The intermediate resin layer was baked at 170° C., and a cyan colored resin layer was formed thereon. The formation of the cyan colored resin layer was carried out in the same manner as in the formation of the yellow colored resin layer except that the dye was replaced with a cyan dye containing an alkali metal in the molecule (Kayanol Milling Turquoise Blue 3G, produced by Nippon Kayaku Co., Ltd., Japan).

The cyan colored resin layer was then covered with another photo-hardening resin layer (1 μm in thickness) using the same copolymer as employed for the formation of the intermediate resin layer. The photo-hardening resin layer was closely covered with a mask having windows in the area other than portions corresponding to the dicing sites and the bonding electrode sites, and exposed to a radiation so as to harden the exposed portion. Thus exposed resin layer was washed to remove the unhardened portion to form a surface-protecting layer.

Thus, a micro-color filter consisting of a yellow colored resin layer, an intermediate resin layer, a cyan colored resin layer, and a surface-protecting layer was formed on the solid-state imaging device wafer.

The micro-color filter was then baked at 170° C. and washed with ammonium fluoride to remove the protective layer of phosphosilicate glass in the area corresponding to the dicing sites and the bonding electrode sites so that the bonding electrode and dicing sites were bared.

The solid-state imaging device wafer carrying thus treated micro-color filter was cut by means of a diamond cutter at the bared dicing sites to give a plurality of solid-state color imaging devices (chips: 6.6 cm × 8.8 cm per each).

Analysis of the chip indicated that each chip contained 52 ppm of $Na^+$ and 13 ppm of $K^+$. For reference, a blank chip (a chip separated from a solid-state imaging devide wafer carrying no micro-color filter) contained 18 ppm of $Na^+$ and 1 ppm of $K^+$.

EXAMPLE 2

A micro-color filter consisting of a yellow colored resin layer, an intermediate resin layer, a cyan colored resin layer, and a surface-protecting layer was formed on the CCD solid-state imaging device wafer in the same manner as in Example 1 except that the yellow dye and cyan dye were replaced respectively with a yellow dye containing substantially no alkali metal (pyridinium salt of C. I. Acid Yellow 141) and a cyan dye containing substantially no alkali metal (pyridinium salt of cuppor phthalocyaninesulfonate).

The solid-state imaging device wafer carrying the micro-color filter was cut to give a plurality of solid-state color imaging devices (chips: 6.6 cm × 8.8 cm per each).

Analysis of the chip indicated that each chip contained 30 ppm of $Na^+$ and 8 ppm of $K^+$.

Comparison Example 1

A gelatin was treateed with lime, and mixed with aqueous ammonium bichromate to prepare an aqueous photo-hardening gelatin solution. Atomic absorption analysis indicated that the photo-hardening gelatin solution contained 186 ppm of $Na^+$ and 57 ppm of $K^+$.

A micro-color filter consisting of a yellow colored resin layer, an intermediate resin layer, a cyan colored resin layer, and a surface-protecting layer was formed on the CCD solid-state imaging device wafer in the same manner as in Example 1 except that the above-mentioned photo-hardening gelatin solution was employed.

The solid-state imaging device wafer carrying the micro-color filter was cut to give a plurality of solid-state color imaging devices (chips: 6.6 cm × 8.8 cm per each).

Analysis of the chip indicated that each chip contained 220 ppm of $Na^+$ and 30 ppm of $K^+$.

We claim:

1. A solid-state imaging device provided with at least one hardened-protein layer thereon characterized in that said hardened-protein layer is made of a photohardening water-soluble protein selected from the group consisting of gelatin and casein whose total alkali metal ion content is not more than 20 ppm.

2. The solid-state imaging device claimed in claim 1, in which said total alkali metal ion content of the protein layer is not more than 10 ppm.

3. The solid-state imaging device claimed in claim 1, in which said total alkali metal ion content of the protein layer is not more than 5 ppm.

4. The solid-state imaging device claimed in any one of claims 1 to 3, in which said water-soluble protein is gelatin.

* * * * *